US011074318B2

(12) United States Patent
Ma et al.

(10) Patent No.: US 11,074,318 B2
(45) Date of Patent: Jul. 27, 2021

(54) HARDWARE ACCELERATED DISCRETIZED NEURAL NETWORK

(71) Applicant: Western Digital Technologies, Inc., San Jose, CA (US)

(72) Inventors: Wen Ma, Milpitas, CA (US); Pi-Feng Chiu, Milpitas, CA (US); Minghai Qin, Milpitas, CA (US); Won Ho Choi, San Jose, CA (US); Martin Lueker-Boden, Fremont, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 267 days.

(21) Appl. No.: 16/452,110

(22) Filed: Jun. 25, 2019

(65) Prior Publication Data

US 2020/0192970 A1 Jun. 18, 2020

Related U.S. Application Data

(60) Provisional application No. 62/780,083, filed on Dec. 14, 2018.

(51) Int. Cl.
*G06F 17/16* (2006.01)
*G11C 13/00* (2006.01)
(Continued)

(52) U.S. Cl.
CPC .............. *G06F 17/16* (2013.01); *G06N 3/08* (2013.01); *G11C 13/0002* (2013.01); *H03M 1/12* (2013.01); *H03M 1/74* (2013.01)

(58) Field of Classification Search
CPC ........... G06F 17/16; H03M 1/74; H03M 1/12; G11C 13/0002; G11C 13/003;
(Continued)

(56) References Cited

U.S. PATENT DOCUMENTS

| 8,954,363 B2 | 2/2015 | Heliot et al. |
| 9,910,827 B2 * | 3/2018 | Muralimanohar ...... G06F 17/16 |

(Continued)

FOREIGN PATENT DOCUMENTS

| KR | 1020180077689 A | 7/2018 |
| WO | 2019012533 A1 | 1/2019 |

OTHER PUBLICATIONS

Ma, "Non-Volatile Memory Array Based Quantization- and Noise-Resilient LSTM Neural Networks", 9 pages. (Year: 2019).*
(Continued)

*Primary Examiner* — Tan V Mai
(74) *Attorney, Agent, or Firm* — Patent Law Works LLP

(57) ABSTRACT

An innovative low-bit-width device may include a first digital-to-analog converter (DAC), a second DAC, a plurality of non-volatile memory (NVM) weight arrays, one or more analog-to-digital converters (ADCs), and a neural circuit. The first DAC is configured to convert a digital input signal into an analog input signal. The second DAC is configured to convert a digital previous hidden state (PHS) signal into an analog PHS signal. NVM weight arrays are configured to compute vector matrix multiplication (VMM) arrays based on the analog input signal and the analog PHS signal. The NVM weight arrays are coupled to the first DAC and the second DAC. The one or more ADCs are coupled to the plurality of NVM weight arrays and are configured to convert the VMM arrays into digital VMM values. The neural circuit is configured to process the digital VMM values into a new hidden state.

24 Claims, 10 Drawing Sheets

(51) Int. Cl.
*G06N 3/08* (2006.01)
*H03M 1/12* (2006.01)
*H03M 1/74* (2006.01)

(58) Field of Classification Search
CPC ...... G11C 2213/77; G11C 11/54; G06N 3/08; G06N 3/0635; G06N 3/0445; G06N 3/084
USPC .................................................. 708/441, 835
See application file for complete search history.

(56) References Cited

U.S. PATENT DOCUMENTS

| | | | |
|---|---|---|---|
| 10,496,855 B2* | 12/2019 | Muralimanohar | .... G06F 7/5443 |
| 2016/0328646 A1 | 11/2016 | Lin et al. | |
| 2017/0286830 A1 | 10/2017 | El-Yaniv et al. | |
| 2018/0082171 A1 | 3/2018 | Merity et al. | |
| 2018/0321942 A1 | 11/2018 | Yu et al. | |
| 2019/0311245 A1* | 10/2019 | Zhang | .................... G06N 3/063 |

OTHER PUBLICATIONS

Burr, Geoffrey W. et al., Neuromorphic computing using non-volatile memory, Advances in Physics: X. vol. 2, Issue 1, pp. 89-124, Dec. 4, 2016, <https://doi.org/10.1080/23746149.2016.1259585>.

Choi, Heeyoul, Persistent Hidden States and Nonlinear Transformation for Long Short-Term Memory, Preprint submitted to Neurocomputing, pp. 1-18, Dec. 7, 2018, pp. 1-18, <https://arxiv.org/abs/1806.08748v2>.

Hui, Jonathan, RNN, LSTM and GRU tutorial, In: Jonathan Hui blog, Mar. 5, 2017, pp. 1-22, <https://jhui.github.io/2017/03/15/RNN-LSTM-GRU/>.

International Search Report and Written Opinion of Application No. PCT/US2019/046924, dated Dec. 6, 2019 (11 pages).

Colah, Understanding LSTM Networks, Colah's Blog Post, Aug. 27, 2015, p. 1-10, https://colah.github.io/posts/2015-08-Understanding-LSTMs/.

Gokmen, T., et al., Training LSTM Networks With Resistive Cross-Point Devices, Frontiers in Neuroscience Research Paper, Oct. 24, 2018, p. 1-10, vol. 12, article 745.

Han, S. et al., EIE: Efficient Inference Engine on Compressed Deep Neural Network, Conference Paper in ISCA, May 3, 2016, p. 1-12, arXiv:1602.01528v2 [cs.CV] May 3, 2016.

Han, S. et al., ESE: Efficient Speech Recognition Engine with Sparse LSTM on FPGA, Proceedings of the 2017 ACM/SIGDA International Symposium on Field-Programmable Gate Arrays, Feb. 20, 2017, p. 1-10, Monterey, CA, USA.

He, Q. et al., Effective Quantization Methods for Recurrent Neural Networks, Nov. 30, 2016, p. 1-10, CoRR, abs/1611.10176.

Hubara, I., et al., Quantized Neural Networks: Training Neural Networks with Low Precision Weights and Activations, Journal of Machine Learning Research, Apr. 2018, p. 1-30, vol. 18.

Li, C. et al., Long short-term memory networks in memristor crossbar arrays, Nature Machine Intelligence, Jan. 2019, p. 49-57, vol. 1, https://doi.org/10.1038/s42256-018-0001-4.

Long, Y. et al., ReRAM-Based Processing-in-Memory Architecture for Recurrent Neural Network Acceleration, IEEE Transactions on Very Large Scale Integration (VLSI) Systems, Dec. 2018, p. 2781-2794, vol. 26, No. 12.

* cited by examiner

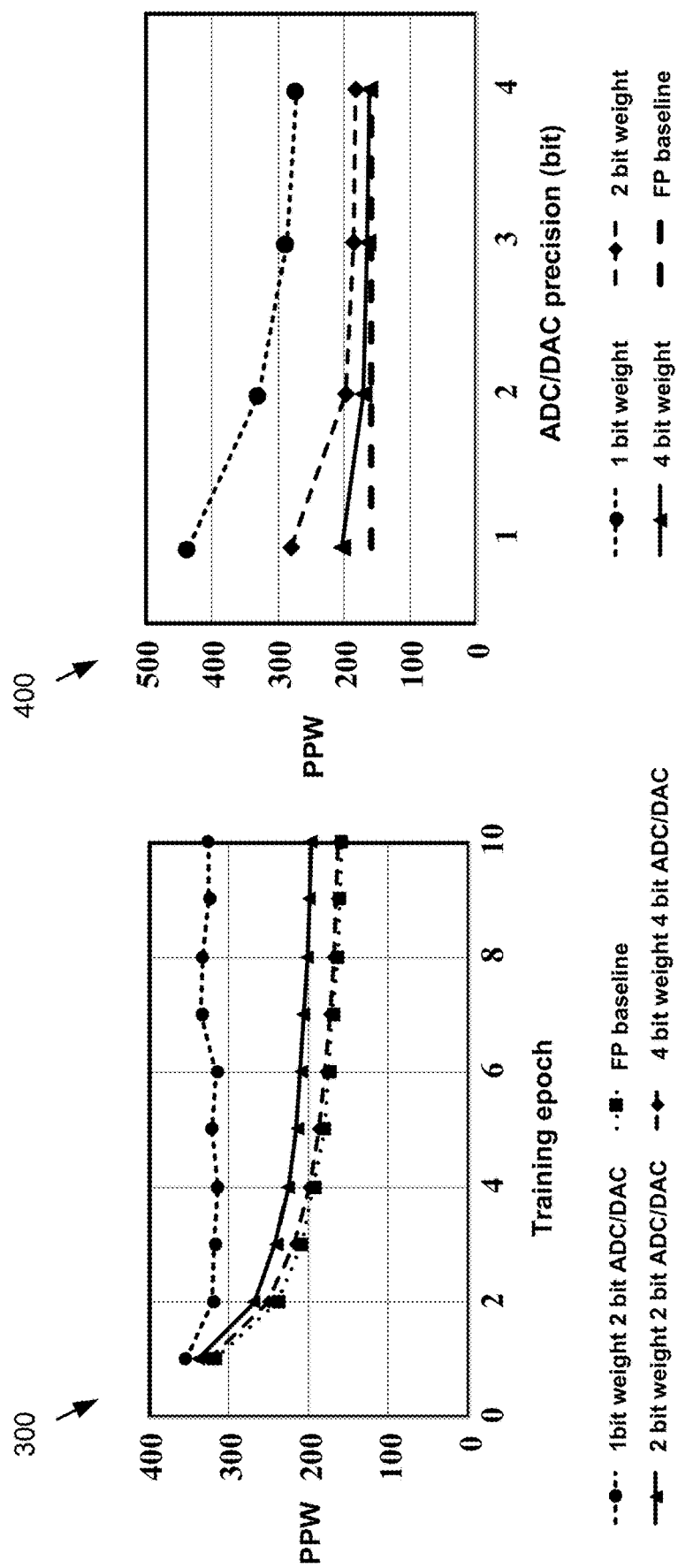

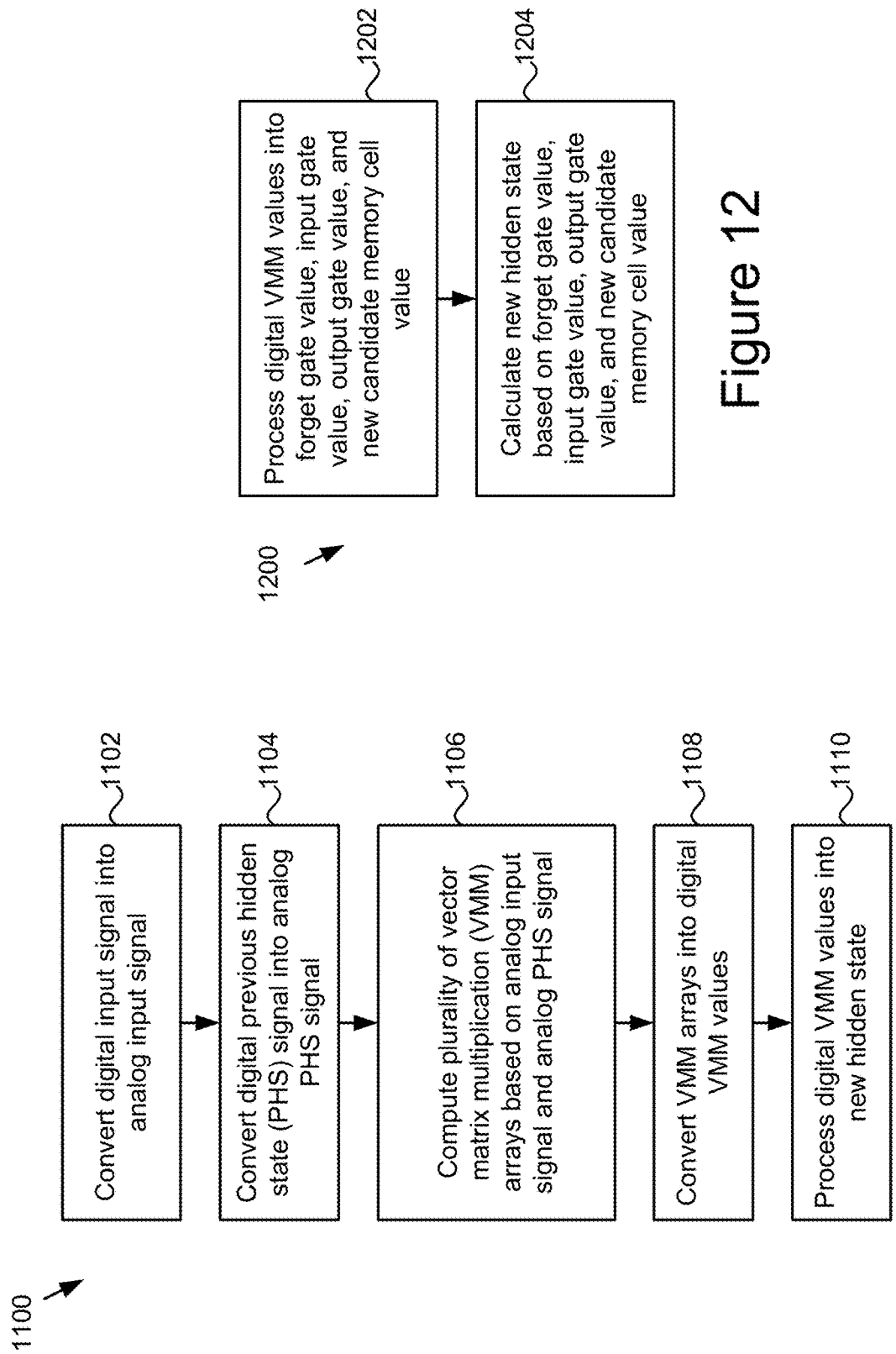

HARDWARE ACCELERATED DISCRETIZED NEURAL NETWORK

TECHNICAL FIELD

The present disclosure relates to data processing using neural networks.

BACKGROUND

Deep neural networks have gained great popularity during the past several years and have become one of the most widely used machine learning technique. Deep neural networks can be broadly classified into two categories: feedforward neural networks and recurrent neural networks, depending on whether there are loops present inside the network topology. Unlike feedforward neural networks such as CNN (Convolutional Neural Network) and MLP (Multilayer Perceptron) that are being used for static input problems like image recognition, object detection, etc., recurrent neural networks such as LSTM (Long Short-Term Memory), GRU (Gated Recurrent Unit), and ESN (Echo State Networks) are suitable for non-static input tasks including speech recognition, time-series prediction, etc. An LSTM neural network (LSTM for short) is a special kind of recurrent neural networks that was first designed to avoid the exploding or vanishing gradient problems during backpropagation, and has now become the state-of-the-art approach for speech recognition. An LSTM, combined with other types of neural networks like CNN, is used by Siri™, Google Voice™ Alexa™, etc. but is usually executed remotely on cloud servers based using a central processing unit (CPU), graphics processing unit (GPU) or tensor processing unit (TPU) computing architecture. It is desirable to have embedded hardware for running LSTM directly on mobile devices or self-driving cars.

Neuromorphic chips are a promising technology that can be integrated with mobile devices considering their advantage in power efficiency and computing speed. They are usually based on (complementary metal oxide semiconductor) CMOS (very large scale integration) VLSI circuits and attempt to mimic the human brain to perform computations by taking advantage of the massive parallelism when billions of neurons and trillions of synapses process and store information. Some of the existing notable efforts on neuromorphic computing hardware systems include IBM's TrueNorth™, Stanford's Neurogrid™, EU's BrainScaleS™, and more recently Intel's Loihi™, etc. In addition to using CMOS based analog/digital circuits, Non-Volatile Memory (NVM) devices can be integrated to accelerate neuromorphic computing or machine learning hardware, as they can be used directly as synaptic weights in artificial neural networks. Some of the popular candidate NVM technologies for neuromorphic computing include ReRAM, PCM, MRAM and Floating Gate Transistors, which all offer a smaller footprint than SRAM or eDRAM technologies.

An NVM array may comprise a plurality of junctions where each junction may include one or more NVM cells. An NVM device including such cells can be constructed into a cross-point-like array, as shown in FIG. 1, which depicts a schematic an NVM crosspoint array 100 used to accelerate Vector-Matrix-Multiplication (VMM) using Ohm's law. The cross-point structure is inspired by biology where each pre-synaptic neuron corresponds to each row and each post-synaptic neuron corresponds to each column, therefore each cross junction may be one synapse, which is represented by one NVM cell, in the example shown as NVM cell 110, although other variations are posssible. When used in the read mode, i.e., the conductance values of the NVM weight cells ($G_{nm}$) are stationary, the NVM array can accelerate VMM (Vector-Matrix Multiplications) operations directly in physics using Ohm's law. The readout current ($I_{out\_m}$) from each column is the dot product of input voltage values ($V_{in\_n}$) from the rows (when encoded in the amplitude of the voltage pulse) and the stationary conductance values ($G_{nm}$) from the NVM cells on that column. Altogether, the readout currents from all the columns comprise the VMM of the input voltage vector and the NVM weight array matrix. This acceleration is critical as VMM is heavily used in most machine learning algorithms.

Such analog VMM realized by using the analog weight array may run into many challenges such as the available NVM cell conductance level is limited to a certain number of bits. Even though ReRAM and PCM can achieve almost continuous incremental conductance change, achieving 32 bit precision of weight is not realistic, while MRAM and NOR Flash are mostly binary-type memory cells. In addition to the limitations posed by the NVM devices, having high precision periphery circuits can be very costly in terms of area and power. Studies have shown that the ADCs connecting the analog weight array to digital circuits compose most of the power consumption. Therefore, there is a need for a low bit precision weight memory array and a periphery circuit component that can maintain performance comparable with that of the software baseline (e.g., 32 bit) implementation while providing power saving advantages.

There have been research efforts studying the binarizing or quantizing the feedforward neural networks like CNN and MLP. Binarizing LSTM is more challenging than binarizing the CNN or MLP as it is difficult to use techniques like batch normalization in a recurrent neural network. While quantized LSTM and bit-width size reduction have been studied, such as the quantization of weights and activations (hidden state) during forward propagation and using straight-through-estimator (STE) to propagate the gradient for weight update, these quantized LSTM studies generally do not account for real hardware implementation constraints, such as those that require quantization on more than just the weights and hidden state.

Thus, while long short-term memory (LSTM) neural networks have been widely used for natural language processing, speech recognition, time series prediction, and other sequential data tasks, current solutions are generally unable to adequately to reduce the bit-width of weights and activations in embedded LSTM neural networks in a way that lowers the memory storage size and computation complexity sufficiently.

SUMMARY

A quantized neural network architecture, which includes various aspects such as devices, systems, methods, apparatuses, computer program products, etc., is described.

According to one innovative aspect, the subject matter described in this disclosure may be embodied in a method including: converting a digital input signal into an analog input signal; converting a digital previous hidden state (PHS) signal into an analog PHS signal; computing, using a plurality of non-volatile memory (NVM) weight arrays, a plurality of vector matrix multiplication (VMM) arrays based on the analog input signal and the analog PHS signal; converting the VMM arrays into digital VMM values; and processing the digital VMM values into a new hidden state.

This and other implementations may each optionally include one or more of the following features: that processing the digital VMM values into the new hidden state further comprises processing the digital VMM values into a forget gate value, an input gate value, an output gate value, and a new candidate memory cell value, and calculating the new hidden state based on the forget gate value, the input gate value, the output gate value, and the new candidate memory cell value; that the NVM weight arrays have a bit-width less than 32 bits; that the NVM weight arrays comprise resistive cross-point arrays; that converting the VMM arrays into the digital VMM values comprises adding an ADC noise component; that one or more of the analog input signal, the analog PHS signal, the plurality of NVM weight arrays, and the digital VMM values are quantized to about 4 bits or less; inputting the new hidden state as the digital PHS on a subsequent iteration of the method; that processing the digital VMM values into the new hidden state further comprises calculating a new memory cell state and calculating the new hidden state based on the new memory cell state.

According to another innovative aspect, the subject matter described in this disclosure may be embodied in a device including: a first digital-to-analog converter (DAC) configured to convert a digital input signal into an analog input signal; a second DAC configured to convert a digital previous hidden state (PHS) signal into an analog PHS signal; a plurality of non-volatile memory (NVM) weight arrays configured to compute a plurality of vector matrix multiplication (VMM) arrays based on the analog input signal and the analog PHS signal, the plurality of NVM weight arrays being coupled to the first DAC and the second DAC; one or more analog-to-digital converters (ADCs) coupled to the plurality of NVM weight arrays, the one or more ADCs configured to convert the VMM arrays into digital VMM values; and a neural circuit configured to process the digital VMM values into a new hidden state.

This and other implementations may each optionally include one or more of the following features: that the one or more ADCs comprise a plurality of ADCs and the neural circuit comprises a plurality of activation components coupled to the plurality of ADCs, where the plurality of activation components are configured to receive and process the digital VMM values; that the neural circuit comprises arithmetic circuitry coupled to the plurality of activation components, the arithmetic circuitry being configured to generate the new hidden state based on an output received from each of the plurality of activation components; a plurality of analog integrate and average components situated between the plurality of NVM weight arrays and the ADCs; that the neural circuit is configured to calculate a new memory cell state, where the new hidden state is generated by the neural circuit based on the new memory cell state; and that an output of one or more of the first DAC, the second DAC, the plurality of NVM weight arrays, and the one or more ADCs is quantized to about 4 bits or less.

According to another innovative aspect, the subject matter described in this disclosure may be embodied in a circuit, including: means for converting a digital input signal into an analog input signal; means for converting a digital previous hidden state (PHS) signal into an analog PHS signal; means for computing a plurality of vector matrix multiplication (VMM) arrays based on the analog input signal and the analog PHS signal; means for converting the VMM arrays into digital VMM values; and means for processing the digital VMM values into a new hidden state.

This and other implementations may each optionally include one or more of the following features: that the means for processing the digital VMM values into the new hidden state further comprises means for processing the digital VMM values into a forget gate value, an input gate value, an output gate value, and a new candidate memory cell value, and means for calculating the new hidden state based on the forget gate value, the input gate value, the output gate value, and the new candidate memory cell value; that one or more of the analog input signal, the analog PHS signal, and the digital VMM values are quantized to about 4 bits or less; that means for inputting the new hidden state as the digital PHS on a subsequent cycle; that that the means for processing the digital VMM values into the new hidden state further comprises means for calculating a new memory cell state and means for calculating the new hidden state based on the new memory cell state; and that the plurality of VMM arrays is further computed using a plurality of non-volatile memory (NVM) weight arrays.

The innovative technology described herein includes numerous advantages, which are described throughout this disclosure. It should be understood that language used in the present disclosure has been principally selected for readability and instructional purposes, and not to limit the scope of the subject matter disclosed herein.

BRIEF DESCRIPTION OF DRAWINGS

The techniques introduced herein are illustrated by way of example, and not by way of limitation, in the figures of the accompanying drawings in which like reference numerals are used to refer to similar elements.

FIG. 3 depicts an example Penn Treebank dataset result.

FIG. 4 depicts an example Penn Treebank dataset result with an exploration of the bit-widths of weight and ADC/DAC.

FIG. 11 depicts a flowchart of an example method for quantized processing of inputs.

FIG. 12 depicts a flowchart of an example method for calculating a hidden state.

DESCRIPTION

Figure 1:
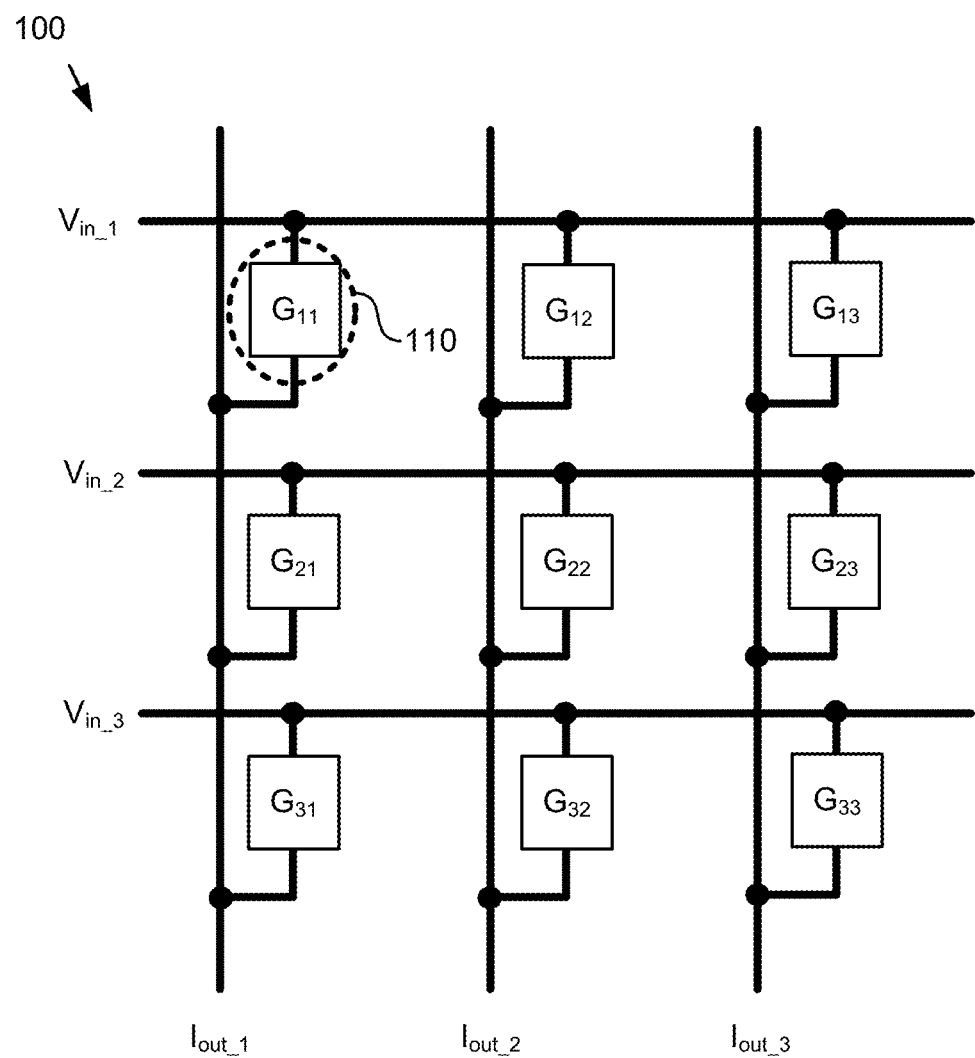
FIG. 1 depicts a schematic an example NVM crosspoint array configured to accelerate Vector-Matrix-Multiplication using Ohm's law.

This application discloses an innovative low-bit-width architecture that includes systems, methods, and other aspects that can be trained, process inputs, and provide predictions efficiently. An example implementation includes an LSTM unit based on NVM (non-volatile memory) weight arrays that can accelerate VMM (vector matrix multiplication) operations. Innovative aspects on the bit precision of the NVM weights and periphery circuit components (ADCs and DACs) are disclosed, as are approaches for addressing noise effects coming from the real hardware device. Various circuits are also provided for various disclosed implementations of a quantized LSTM unit.

Beneficially, the technology described herein can effectively quantize LSTM neural networks and includes a hardware design that provides state-of-the-art machine learning while lowering memory size and computation complexity. Specifically, by way of example, the NVM weights, analog-to-digital converter(s) (ADCs), digital-to-analog converters (DACs), and NVM cross-point arrays described herein can accelerate the VMM operations that are heavily used in most machine learning algorithms for artificial neural networks, including but not limited to LSTM, CNN and MLP. However, it should be understood that the innovative technology described herein is generally applicable to any type of non-volatile memory architecture, such as but not limited to NAND-type flash memory, NOR-type flash memory, phase-change random access memory (PCRAM), resistive random-access memory (ReRAM), spin-transfer torque random access memory (STT-RAM), magnetoresistive random-access memory (MRAM), Ferroelectric RAM (FRAM), phase change memory (PCM), etc.

While natural language processing is discussed in various implementations provided herein, the technology is applicable to variety of uses cases, such as speech recognition, natural language processing, signal processing and interpretation, data security, general classification, image recognition, recommendations, and prediction, etc., and can receive and process any suitable inputs for such use cases. By way of example, the quantized architecture described herein can be configured to receive and interpret data streams, sensor data, and/or other data inputs and process them to provide contextually relevant predictions, such as behavioral predictions. For instance, the technology may be implemented as hardware and/or software in a portable electronic device that is coupled to one or more sensors. In further examples, the quantized architecture can be used for video analysis, handwritten digit stroke recognition, and human activity recognition, etc.

In a more specific example, a quantized LSTM device, as described herein, may be embedded in a client device to provide it with more robust artificial intelligence (AI) functionality. Such an implementation would, for instance, not require the device to have a network data connection to transmit data over the Internet to a server (e.g., to the cloud) so the data can be processed with machine learning logic. Instead, a device equipped with a quantized LSTM device can beneficially provide offline AI functionality (unlike current digital assistant solutions (e.g., Siri™, Google Voice™, Alexa™, etc.) which are unable to function when network instability or interruptions occur). Moreover, devices equipped with such low-power embedded hardware can run deep neural networks algorithms directly on power and/or processing-limited or restricted systems, such as mobile devices and self-driving cars.

Example sensors may include, but are not limited to, photo sensors, gyroscopes, accelerometers, heart rate monitors, position sensors, touch sensors, capacitive sensors, thermometers, sound sensors, light sensors, proximity sensors, thermocouples, motion sensors, transceivers, etc. Example devices coupled to and/or including the sensors and/or the quantization-aware devices processing the sensor data from the sensors may include, but are not limited to storage drives, portable electronic devices (e.g., personal computers, tablets, phones, wearables, digital assistants), voice activated devices, Internet-of-things (IOT) devices, vehicle computers, servers, storage racks, etc.

The technology may receive input from the one or more sensors, efficiently process the inputs with the low-bit-width architecture described herein, learn from the processed inputs, and provide predictions based on the processing. In some cases, an implementation may receive and process raw or pre-processed sensor data received from the one or more sensors, although other variations are also possible.

Figure 13:
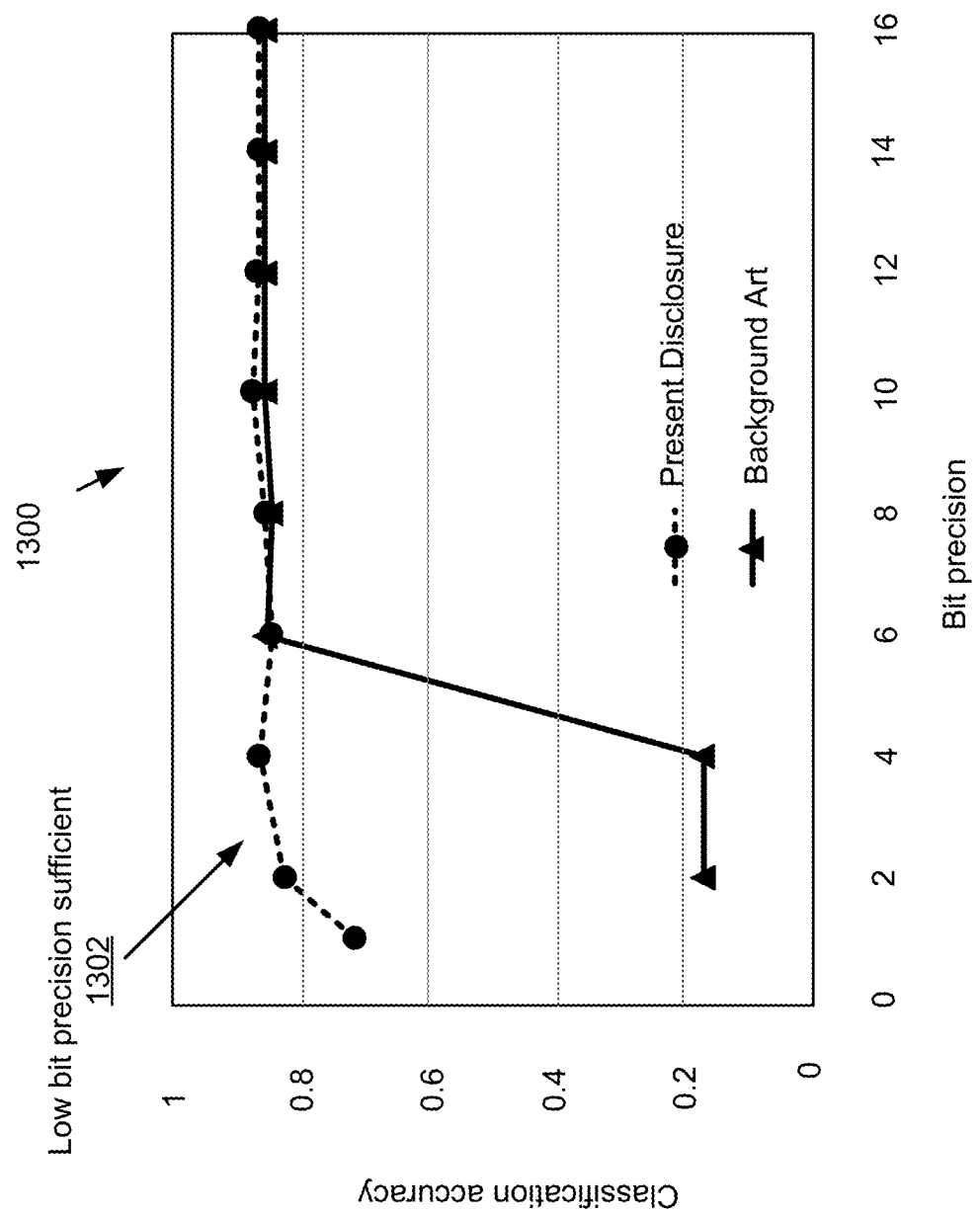
FIG. 13 depicts a graph showing example classification accuracy relative to bit precision.

As a further example, FIG. 13 depicts a graph 1300 depicting classification accuracy of a quantization-aware trained prediction unit according to the implementations described herein. In particular, the prediction unit was trained with sensor data reflecting six daily activities: walking, walking upstairs, walking downstairs, sitting, standing, and laying, and then used to classify new sensor data reflecting the various different activities of a person. As shown in the graph, the prediction unit is capable of providing much more accurate (e.g., 70%+ in this use case) predictions of user activity using an architecture with low bit precision (e.g., 1-5 in this case), whereas the background art (which uses full precision numbers for training, floating point baseline) was unable to provide similarly accurate predictions at comparable low bit width/precision levels.

Figure 2:
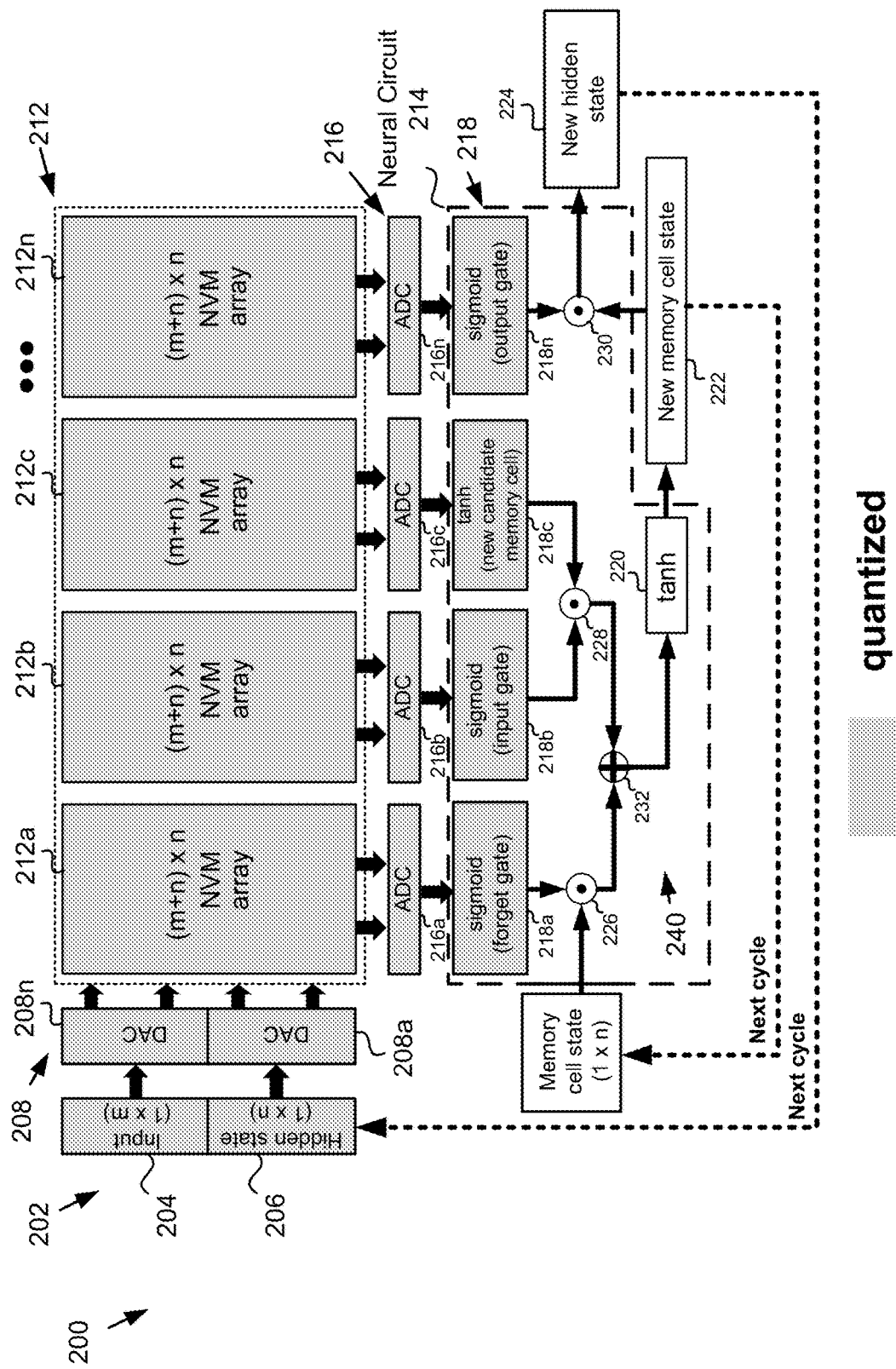
FIG. 2 depicts an architecture of an example NVM weight array accelerated LSTM unit.
Figure 14:
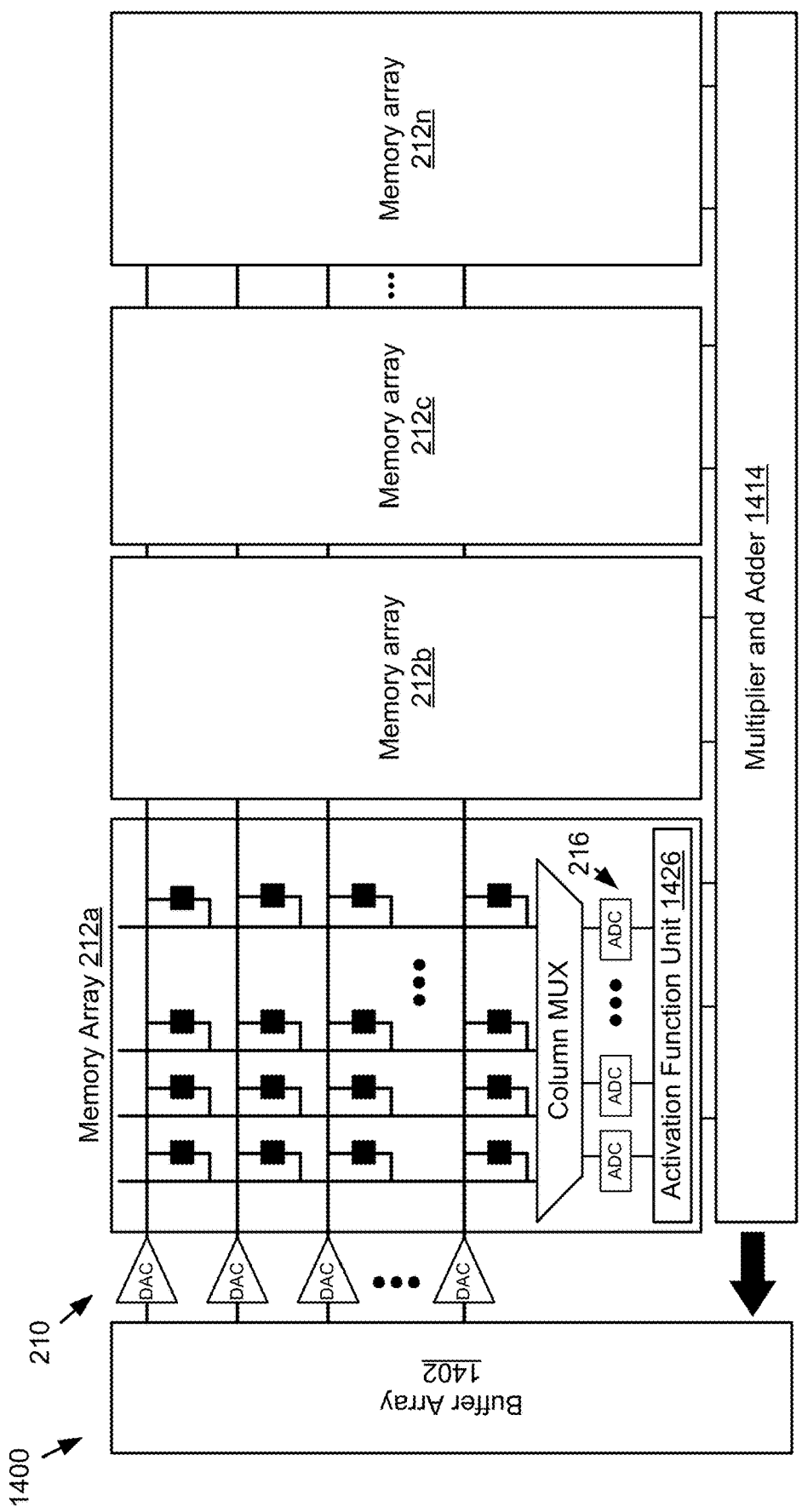
FIG. 14 depicts an example low-bit-width processing architecture.

FIG. 2 depicts an example of a quantized LSTM device 200, and FIG. 14 depicts a further example architecture of the device 200. As shown in FIG. 2, the device 200 may include a plurality of DACs 208a . . . 208n (also individually or collectively 208), such as a first DAC configured to convert a digital input signal 204 into an analog input signal and a second DAC configured to convert a digital previous hidden state (PHS) 206 signal into an analog PHS signal. The DACs 208 may be coupled to provide input to a plurality of memory arrays 212a . . . 212n (also individually or collectively 212). In some embodiments, each memory array 212 may be coupled to a DAC 208 (dedicated or shared) to receive input therefrom. In some embodiments, one DAC 208 may supply all of the memory arrays 212, each memory array 212 have a dedicated DAC 208, or some memory arrays may share a DAC 208.

The plurality of memory arrays 212a . . . 212n may be coupled to a plurality of ADCs 216a . . . 216n (also individually or collectively 216), and the plurality of ADCs 216a . . . 216n may be coupled to a plurality of activation components 218a . . . 218n. Advantageously, various components of the device 200 may be quantized. For instance, an output of one or more of the first DAC, the second DAC, the plurality of NVM weight arrays, and the ADCs may be quantized to various degrees, as discussed elsewhere herein (e.g., to about 4 bits or less).

In some embodiments, the activation components 218a . . . 218n may be the same components or different components. As depicted, the activation components 218 comprise a forget gate 218a, an input gate 218b, a new candidate memory cell 218c, and an output gate 218n. The forget gate 218a, the input gate 218b, the new candidate memory cell 218c, and the output gate 218n may be connected to logic units that perform operations on their output.

As further shown in FIG. 14, architecture 1400 of the device 200, may include logical circuitry 1414 (e.g., multiplier and adder circuitry in this embodiment) that is coupled to the memory arrays 212a . . . 212n to receive their output and process it. The multiplier and adder circuitry 1414 may be coupled to the buffer array 1402 to store data. In some embodiments, the multiplier and adder circuitry 1414 may store the states computed by it in the buffer array 1402 for access by DACs 208 and/or other components. The multiplier and adder circuitry 1414 may be coupled to the activation function unit 1426, which may comprise the activation components (such as the activation components 218 in FIG. 2), and may send signals to and receive signals from the multiplier and adder circuitry 1414.

Returning to FIG. 2, the activation components 218, and arithmetic circuitry 240 (which may comprise the multipliers, adders, and/or any other suitable logic), and/or other suitable components may collectively make up a neural circuit 214 that provides the machine learning functionality described herein, in association with the other components that are described. For instance, the neural circuit 214 may be configured to process the digital VMM values into a new hidden state.

While the implementations depicted in FIGS. 2 and 14 reflect a device in which the components are coupled by a communications bus, wiring, and/or other connection components, it should be understood that other variations are contemplated where one or more of the components may be distributed across devices and coupled via a network using networking hardware.

In the implementation depicted in FIG. 2, which reflects the architecture of an example NVM weight array-accelerated LSTM unit, the forget gate 218a may be connected to multiplier 226, the input gate 218b and the new candidate memory cell 218c may be coupled to multiplier 228, and the output gate 218n may be coupled to multiplier 230. The multipliers 226, 228, and 230 respectively perform multiplication operations and provide their output to downstream components to which they are coupled. In particular, multipliers 226 and 228 provide their output to adder 232, which in turn performs addition on the output and provides it to a scaling component 220 (e.g., tan h function). The tan h function can scale the output and output it as a new memory cell state 222. The new memory cell state is communicated to the multiplier 230, which multiplies it with the output of the output gate 218n. The output of the multiplier 230 embodies a new hidden state 224 which is provided as an input for the next operational cycle (206). The new memory cell state 222 is also provided as an input to the multiplier 226 for the next operational cycle.

As shown by the shading in FIG. 2, certain elements of the quantized LSTM device 200 can be quantized. The various example quantization levels are further described below. In a more specific non-limited example, as demonstrated in two example natural language processing tasks described herein, a 4 bit NVM weight cell along with at least 2 bit ADC/DAC in the LSTM unit can deliver comparable performance as a floating-point baseline. For a simpler dataset for character level prediction, a 2 bit NVM weight cell along with 2 bit ADC/DAC also does not show noticeable degradation in performance. While ADC read noise and NVM weight noise can both harm the training results, these issues can be addressed using filters and/or employing redundant runs using multiple parallel NVM cells as one synaptic weight element, which can average out the weight noise caused by device variations.

Forward and backward propagation may be used in the quantized LSTM device 200 during training or inference. For instance but not limitation, during training and inference, forward propagation may be used to quantize the weights, internal activations (e.g., ADCs), and input/output (e.g., DACs). Additionally or alternatively, during training, backward propagation may be implemented using a straight-through-estimator (STE) to propagate the gradients (using a floating-point number for a weight update).

In an example hardware-accelerated quantized LSTM embodiment, the forward propagation operation of the LSTM unit contains 4 vector-matrix multiplications, 5 non-linear activations, 3 element-wise multiplications, and 1 element-wise addition. As shown in Equation (1)-(4), the hidden state of the previous time step $h_{t-1}$ is concatenated with the input of the current step $x_t$ to form the total input vector being fed into the weight arrays $W_f$, $W_i$, $W_o$ and $W_c$ to perform the VMM. The VMM results can be passed into 4 nonlinear activation function units 218 respectively to get the values of forget gate $f_t$, input gate $i_t$, output gate of and new candidate memory cell $c\_c_t$. The new memory cell $c_t$ is comprised of the new information desired to be added by multiplying the new candidate memory $c\_c_t$ with input gate $i_t$, and the old information desired to be not forgotten by multiplying the old memory cell $c_{t-1}$ and forget gate $f_t$, shown in Equation (5). The final hidden state $h_t$ is calculated by the multiplier 230 by multiplying the output gate $o_t$ and the activation of the new memory cell $c_t$, shown in Equation (6). During backpropagation, the values of $W_f$, $W_i$, $W_o$ and $W_c$ are updated according to the training algorithm, usually based on the stochastic gradient descent.

$$f_t = \text{sigmoid}[x_t, h_{t-1}]W_f) \quad (1)$$

$$i_t = \text{sigmoid}[x_t, h_{t-1}]W_i) \quad (2)$$

$$o_t = \text{sigmoid}[x_t, h_{t-1}]W_o) \quad (3)$$

$$c\_c_t = \tan h([x_t, h_{t-1}]W_c) \quad (4)$$

$$c_t = f_t \cdot c_{t-1} + i_t \cdot c\_c_t \quad (5)$$

$$h_t = o_t \cdot \tan h(c_t) \quad (6)$$

In an example NVM weight array-accelerated LSTM unit, the 4 vector-matrix multiplications to calculate the forget gate, input gate, output gate, and new candidate memory cell can be accelerated by NVM weight arrays, as shown in FIG. 2. Four (4) weight arrays representing $W_f$, $W_i$, $W_o$ and $W_c$ can be concatenated into a whole NVM array to calculate the VMM results in parallel. As the input $x_t$ 204 and the previous hidden state $h_{t-1}$ 206 processed after the DACs 208 are in the form of analog voltages, NVM weight arrays 212 are resistive cross-point arrays, the VMM results are therefore in the form of analog currents that can go through the ADCs 216 to be converted into digital voltages. The digital voltages representing the VMM results can then be fed into different activation function units 218 (either sigmoid or tanh) to get the final values of the forget gate $f_t$, input gate $i_t$, output gate of and new candidate memory cell $c\_c_t$ that can later be processed in other hardware components to generate the new hidden state $h_t$ (224), which can then be fed into the DAC(s) 208 in the next cycle as part of the total input vector.

Advantageously, a quantized LSTM neural network based on the NVM array architecture can provide accuracy performance that is comparable with that of a floating-point baseline (32 bit) implementation, even when lower bit-width NVM cells along with ADC/DACs are used. This beneficially can reduce costs and resource utilization as typically the higher the bit-width of the ADC or DAC, the higher the cost and area/power consumption. Further, in an NVM-specific implementation in which there may be limitations on the available number of stable resistance states on a single NVM cell, the technology described herein can lower the quantization bit precision of the weights. This enables use of a wider class of NVMs, including those NVMs typically not suited for high-precision bit level (e.g., 32-bit) implementations. As mentioned above, even though ReRAM and PCM can achieve almost continuous incremental conductance change, achieving 32 bit precision of weight is not realistic, while MRAM and NOR Flash are mostly binary-type memory cells.

Depending on implementations, the output of some or all of the highlighted blocks (associated with the "quantized" label at the bottom) in FIG. 2 can be quantized to a value less than 32 bit, such as between 1 and 16 bit, such as 8 bit, 4 bit, 2 bit, or any other suitable value. In some embodiments, 4 bit or a value less than 4 bit is used. Note that in some embodiments the activation units 218 may also quantize naturally as the digital circuits to achieve such activation functions, such as through lookup tables (LUT).

Example Bit Precision Requirement on LSTM Weight Array and Circuit Components.

To evaluate the performance of an example implementation of the disclosed quantized LSTM neural network based on the NVM array architecture, various natural language processing tasks are may be used, such as Penn Treebank and national name prediction. As described herein, various different example bit precisions of the weights and ADC/DACs were used and compared with a floating-point baseline. The input embeddings and output embeddings may or may not be quantized depending on the use case.

Penn Treebank.

The Penn Treebank dataset, in the following example, contains 10K unique words from Wall Street Journal material annotated in Treebank style. As with the Treebank corpus, the task is to predict the next word so the performance is measured in perplexity per word (PPW). The perplexity is roughly the inverse of the probability of correct prediction. The hidden state size is fixed at 300.

FIG. 3 depicts a Penn Treebank dataset result in graph 300. As can be seen from FIG. 3, as training progresses, the validation perplexity continues decreasing for the floating-point (FP) baseline, 2 bit weight 2 bit ADC/DAC, and 4 bit weight 4 bit ADC/DAC cases. The 1 bit weight 2 bit ADC/DAC example case shows a less successful training as the validation perplexity fluctuates and does not converge, while the 4 bit weight 4 bit ADC/DAC case produces a competitive training result with the FP baseline without noticeable degradation. Stated another way, FIG. 3 shows that perplexity does not converge for the 1 bit weight 2 bit ADC/DAC case while the other bit-width configurations produce successful training. It also shows 4 bit weight 4 bit ADC/DAC can generate close-to-equivalent training result with the FP.

To fully explore the bit-width requirement on the weights and ADC/DAC, all combinations of bit precision ranging from 1 to 4 bit were tested. FIG. 4 depicts a Penn Treebank dataset result in graph 400 with full exploration of the bit-widths of weight and ADC/DAC, and in which the PPW is measured as the validation perplexity after 10 epochs of training. As shown, a 4 bit weight along with at least 2 bit of ADC/DAC may is desirable to achieve a comparable result with the floating-point baseline (less than 5% of perplexity increase). It can also be loosely concluded that the high bit precision of the weight plays a relatively more important role than the high bit precision of the ADC/DAC for the general performance of the LSTM network, as the PPW achieved at 1 bit weight 2 bit ADC/DAC is higher than that achieved at 2 bit weight 1 bit ADC/DAC. A similar phenomenon can be observed by comparing the 2 bit weight 4 bit ADC/DAC case performance and the 4 bit weight 2 bit ADC/DAC case performance. Therefore, improving the resolution of the conductance levels of the NVM cells may be a higher priority than using high precision peripheries, although both could be applicable in some cases.

Character Prediction.

A simpler task than the Penn Treebank is the national name prediction where the next character is predicted instead of the next word. The perplexity metric here is for per character. The hidden state size is fixed at 256. After 8,000 training iterations, the training perplexity and accuracy were measured. As can be seen from Table I, in terms of both training perplexity and accuracy, 2 bit weight 2 bit ADC/DAC is sufficient to produce a result within 5% degradation compared to the floating-point baseline (32 bit) case. As compared to the result from the Penn Treebank, a lower bit precision requirement on the weight and ADC/DAC is needed in this example case for the simpler character prediction task. To conclude and summarize from both tasks, a 4 bit weight 4 bit ADC/DAC can ensure almost-zero degradation for the online training performance. Such bit-width requirements also naturally help to ensure the performance of the inference whose result is not shown here, although other combinations of lower bit weight and bit ADC/DAC values can also produce results within acceptable parameters depending on the implementation.

TABLE I

NATIONAL NAME PREDICTION RESULT. TRAINING PERPLEXITY AND ACCURACY AT DIFFERENT BIT-WIDTHS CONFIGURATIONS
National name prediction result

| LSTM configuration | Training accuracy (%) | Training perplexity (per character) |
|---|---|---|
| Floating point baseline | 85.09 | 1.52 |
| 1 bit weight + 1 bit ADC/DAC | 72.82 | 2.27 |
| 2 bit weight + 2 bit ADC/DAC | 83.6 | 1.58 |
| 4 bit weight + 4 bit ADC/DAC | 85 | 1.55 |

Example Effect of Device and Circuit Noise.

In addition to the low bit precision of NVM weight cells and ADC/DAC circuit components, non-ideal effects coming from the hardware may be considered. For instance, the hardware noise can be broadly classified into read noise and write noise. The read noise can be reflected on the ADC noise when a readout operation is performed during forward propagation, while the write noise can be reflected on the weight noise after the weight update is performed during back propagation.

Example Effect of ADC Noise.

The ADC read noise can distort the correct VMM result. To simply model the ADC noise coming mainly from the transistors within the ADCs, an additive noise term may be added to the values at the forget gate, input gate, output gate and new candidate memory cell before the ADC quantization and activation function units. The noise follows a Gaussian distribution with a standard deviation proportional to the total input current range. For example, at the forget gate:

$$f_t = \text{sigmoid}([x_t, h_{t-1}]W_f + Z) \quad (7)$$

$$Z \sim N(0, \sigma^3), \sigma = \alpha(I_{max} - I_{min}) \quad (8)$$

Z is the ADC noise vector with the same dimension as $[x_t, h_{t-1}]W_f$. It follows a Gaussian distribution with zero mean and a standard deviation σ ranging from 0 to 20% of the maximum input signal range $I_{max}-I_{min}$. The percentage of the input VMM signal range α is defined as the ADC noise ratio. Using α from 0 to 20% may be realistic with an actual ADC hardware situation, depending on the use case, although other values may apply.

Figures 5, 6:
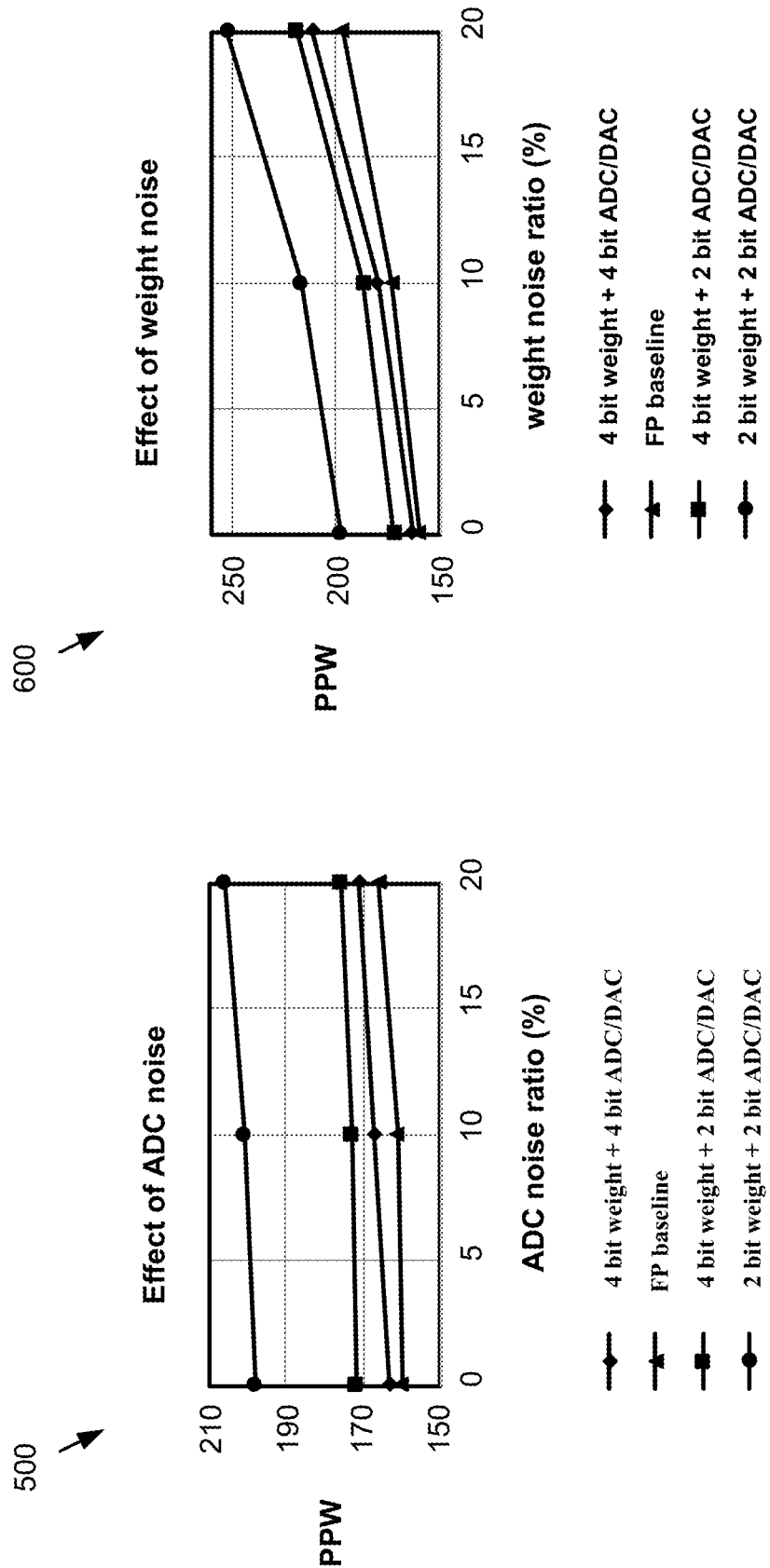
FIG. 5 depicts a graph showing the example effect of ADC noise on the Penn Treebank embodiment.
FIG. 6 depicts a graph showing the example effect of weight noise on the Penn Treebank embodiment.

FIG. 5 depicts a graph 500 showing the effect of ADC noise on the Penn Treebank embodiment. Some example bit-widths configurations for weight and ADC/DAC were considered in these results to compare with floating point baseline. As can be seen from FIG. 5, the influence of ADC noise on the training performance is quite small, especially when the ADC bit-width is low, such as 2 bit. The experiment was run on the Penn Treebank corpus measuring the validation perplexity after 10 epochs of training.

Effect of Weight Noise.

Similarly, the effect of weight noise caused by NVM device variations may also be considered. Due to mostly extrinsic fabrication issues or intrinsic device stochastic nature, the spatial device-to-device variation may be relevant when $i_t$ comes to NVM array operations. Instead of programming the resistance to the desired values, the actual resistance values of different cells can deviate from the ideal values, especially when there is no read-verify after programming. And this can potentially harm the training or inference result. To model the weight noise, an additive noise term may be added to the values of the weight arrays. The noise follows a Gaussian distribution with a standard deviation proportional to the total weight range. For example, at the forget gate:

$$f_t = \text{sigmoid}([x_t, h_{t-1}](W_f + Z)) \quad (9)$$

$$Z \sim N(0, \sigma^2), \sigma = \beta(w_{max} - w_{min}) \quad (10)$$

Z is the weight noise matrix with the same dimension as $W_f$. It follows a Gaussian distribution with zero mean and a standard deviation σ ranging from 0 to 20% of the total weight range $w_{max}-w_{min}$. The percentage of the weight range β is defined as the weight noise ratio. Using β from 0 to 20% may be realistic with actual NVM device performance in some cases, although other values may apply.

FIG. 6 depicts a graph 600 showing the effect of weight noise on the Penn Treebank embodiment. Some example bit-widths configurations for weight and ADC/DAC were considered in the results to compare with floating point baseline. As can be seen from FIG. 6, the weight noise seems to have a more harmful effect than the ADC noise on the LSTM network training performance with the same Penn Treebank experiment setup.

Example Noise Tolerance Techniques.

Advantageously, while not required and depending on the use case, the following approach can be used without modifying the training algorithms or using any post error correction methods which usually introduce significant latency, space, and power overhead if needed. In particular, the approach may instead add reasonable redundancy in either running cycles or area to trade for better LSTM performance, although other hybrid approaches may apply and be used depending on the use case.

Using Redundant Runs.

Figure 7:
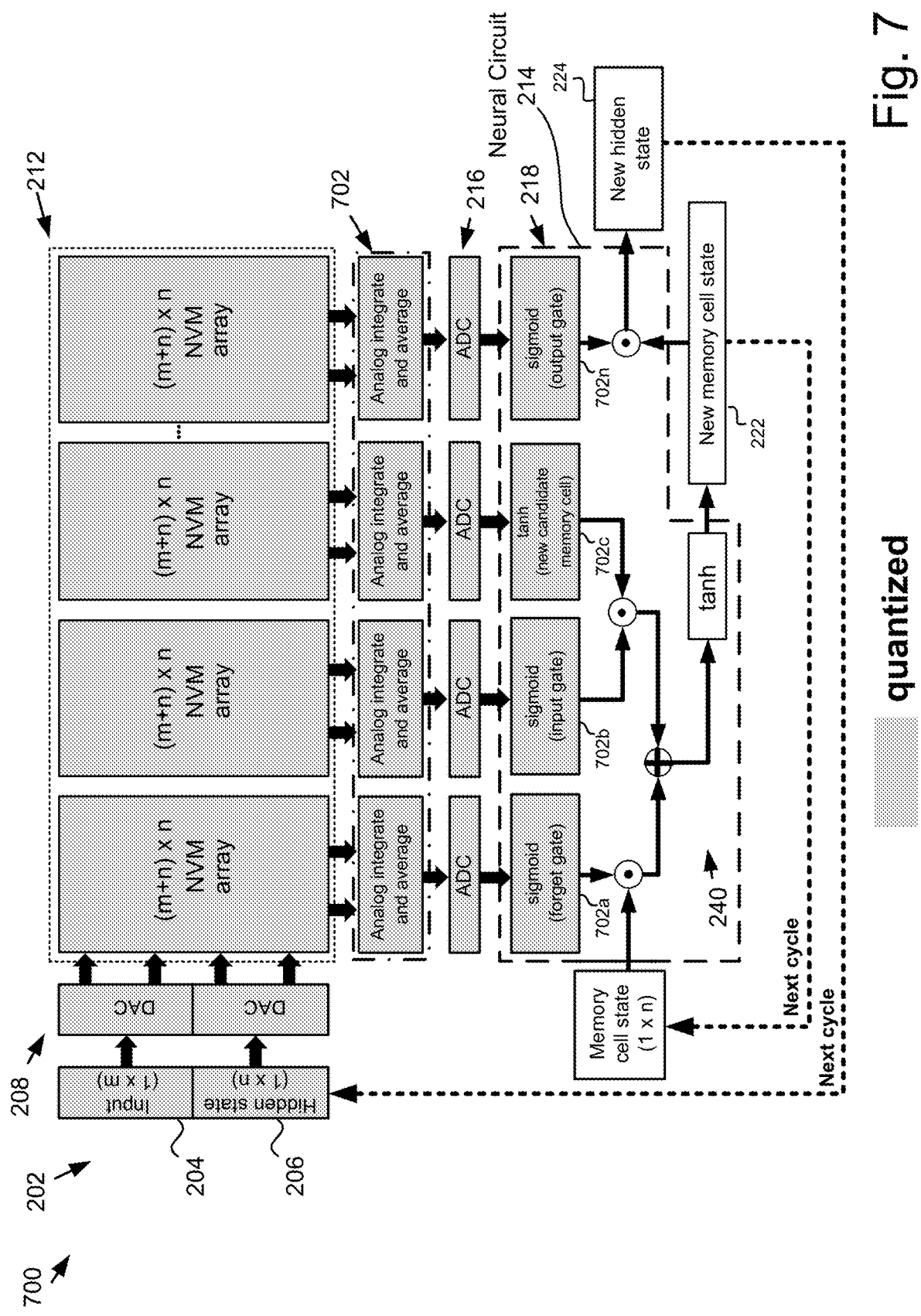
FIG. 7 depicts a schematic of a further example architecture of an NVM weight array accelerated LSTM unit that uses redundant runs to address ADC noise.

To address the ADC read noise, an ADC noise component can be added, such as an averaging component. In some embodiments, redundant runs can be used to average the results before the ADC quantization and activation function units, as indicated by the averaging blocks (e.g., analog integrate and average) blocks 702 in FIG. 7, which depicts a schematic of a further example architecture of an NVM weight array accelerated LSTM device that uses redundant runs to address the ADC noise. As shown, analog integrate and average units 702 are added between the memory arrays 212 and the ADCs 216 (e.g., after the NVM arrays 212 and before the ADCs 702) so that the values of the forget gate, input gate, output gate, and new candidate memory cell can be an averaged result from redundant runs, and can then be used for subsequent element-wise calculations. In some further embodiments, suitable averaging blocks could be situated elsewhere, such as between the activation units and the element-wise calculations.

Figure 8:
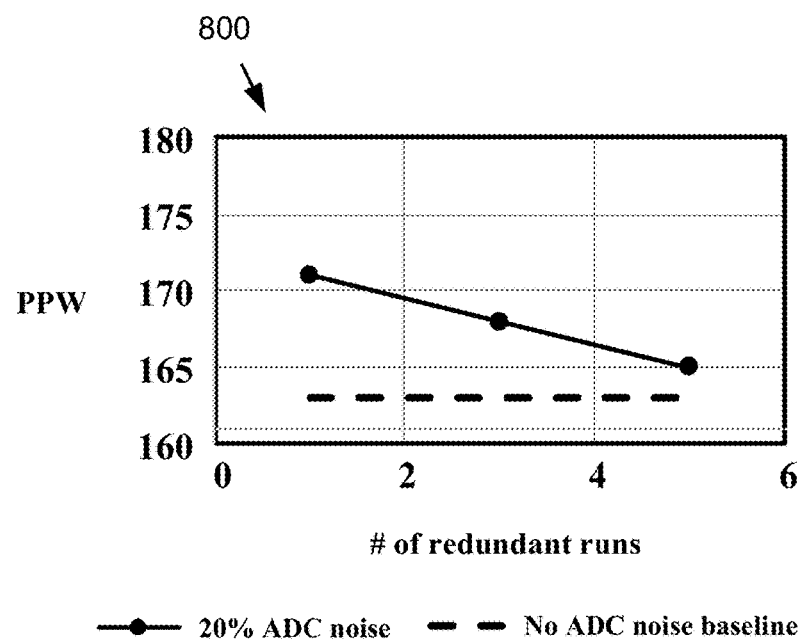
FIG. 8 depicts example results of the method of using redundant runs to address ADC noise.

The approach is tested with the Penn Treebank corpus with 4 bit weight 4 bit ADC/DAC configuration, and it is shown that for 20% ADC noise using 3 or 5 redundant runs is sufficient to improve the training performance to some extent. FIG. 8 depicts example graph 800 showing a result of the method of using redundant runs to address the ADC noise effect. While in the illustrated case improvement is moderate, performance degradation was not severe to begin with. In severe cases, improvement may be commensurately greater.

Using Multiple Parallel NVM Cells as One Synapse.

Figure 9:
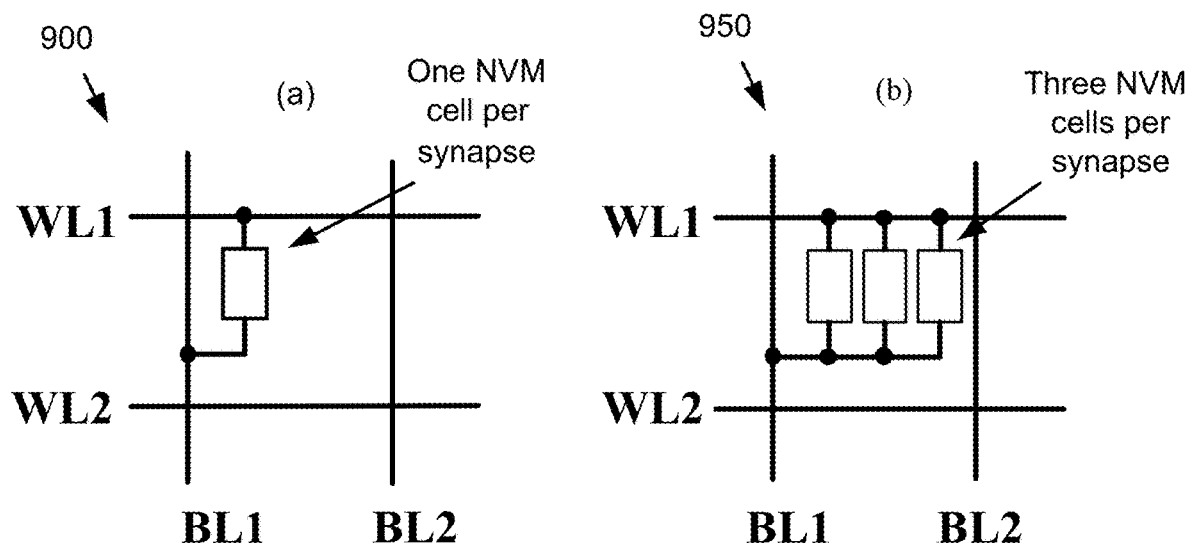
FIG. 9 depicts various example configurations for suppressing weight noise.

To address the weight noise/device variation issue, multiple NVM cells can be connected in parallel to represent one synaptic weight element, instead of just using one NVM cell as one synaptic weight element. Such an implementation in the resistive cross-point array is shown in FIG. 9, which depicts various example configurations 900 and 950 for suppressing weight noise (e.g., parallel NVM weight cells). In particular, (a) shows a first approach of using one NVM cell to represent one synaptic weight, and (b) shows a further approach that uses three parallel NVM cells to represent one weight element as an example implementation (three is shown as an example only as other numbers can be used). The variation or noise effect can be statistically averaged out by taking the summed current from the multiple parallel cells.

Figure 10:
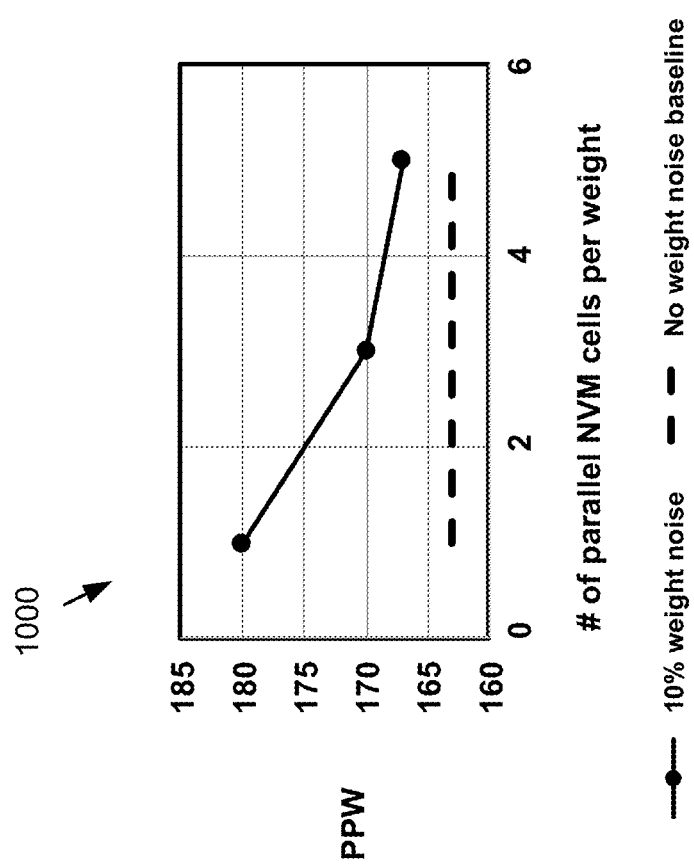
FIG. 10 depicts a graph showing example results obtained from using multiple parallel NVM cells per weight to address the weight noise effect.

From the simulation test on a 10% weight noise example case, it can be seen that using just 3 or 5 parallel NVM cells can improve the training performance significantly. FIG. 10 depicts a graph 1000 showing example results obtained from using multiple parallel NVM cells per weight to address the weight noise effect. The simulation was run on the Penn Treebank corpus with 4 bit weight 4 bit ADC/DAC configuration. By optimizing the layout of these parallel NVM devices, such as by sharing the wordlines (WLs) and bitlines (BLs) shown in FIG. 9, the area overhead can be advantageously reduced to a relatively small amount.

FIG. 11 depicts a flowchart of an example method 1100 for quantized processing of inputs. In block 1102, the method 1100 converts a digital input signal into an analog input signal. The digital signal, in some embodiments, may comprise sensor data from one or more sensors coupled to, for instance, a DAC 208 (e.g., directly or via intervening components). In block 1104, the method 1100 converts a digital previous hidden state (PHS) signal into an analog PHS signal. For example, a DAC 208 may receive the previous state from the buffer array 1402 and/or directly from an arithmetic logic unit (e.g., 1414). In block 1106, the method 1100 computes, using a plurality of non-volatile memory (NVM) weight arrays (e.g., 212), a plurality of vector matrix multiplication (VMM) arrays based on the analog input signal and the analog PHS signal. In some implementations, the NVM weight arrays have a bit-width less than 32 bits and/or may comprise resistive cross-point arrays. In block 1108, the method 1100 converts the VMM arrays into digital VMM values, and in block 1110, the method 1100 processes the digital VMM values into a new hidden state. In some implementations, converting the VMM arrays into digital VMM values may comprise adding an ADC noise component.

FIG. 12 depicts a flowchart of an example method 1200 for calculating a hidden state. In block 1202, the method 1200 processes the digital VMM values into a forget gate value, an input gate value, an output gate value, and a new candidate memory cell value. In block 1204, the method 1200 calculates the new hidden state based on the forget gate value, the input gate value, the output gate value, and the new candidate memory cell value. The method 1200, on a subsequent cycle, may input the new hidden state as a previous hidden state on a subsequent iteration of the method 1100, such as in block 1104.

The foregoing description, for purpose of explanation, has been described with reference to various embodiments and examples. However, the illustrative discussions above are not intended to be exhaustive or to limit the claimed invention to the precise forms disclosed. Many modifications and variations are possible in view of the above teachings. The various embodiments and examples were chosen and described in order to best explain the principles of the innovative technology described herein and its practical applications, to thereby enable others skilled in the art to utilize the innovative technology with various modifications as may be suited to the particular use contemplated.

What is claimed is:

1. A method comprising:
   converting a digital input signal into an analog input signal;
   converting a digital previous hidden state (PHS) signal into an analog PHS signal;
   computing, using a plurality of non-volatile memory (NVM) weight arrays, a plurality of vector matrix multiplication (VMM) arrays based on the analog input signal and the analog PHS signal;
   converting the VMM arrays into digital VMM values; and
   processing the digital VMM values into a new hidden state.

2. The method of claim 1, wherein processing the digital VMM values into the new hidden state further comprises:
   processing the digital VMM values into a forget gate value, an input gate value, an output gate value, and a new candidate memory cell value; and
   calculating the new hidden state based on the forget gate value, the input gate value, the output gate value, and the new candidate memory cell value.

3. The method of claim 1, wherein the NVM weight arrays have a bit-width less than 32 bits.

4. The method of claim 1, wherein the NVM weight arrays comprise resistive cross-point arrays.

5. The method of claim 1, wherein converting the VMM arrays into the digital VMM values comprises adding an analog-to-digital conversion (ADC) noise component.

6. The method of claim 5, wherein adding the ADC noise component comprises adding the ADC noise component before or after an ADC quantization.

7. The method of claim 1, wherein one or more of the analog input signal, the analog PHS signal, the plurality of NVM weight arrays, and the digital VMM values are quantized to about 4 bits or less.

8. The method of claim 1, further comprising inputting the new hidden state as the digital PHS on a subsequent iteration of the method.

9. The method of claim 1, wherein processing the digital VMM values into the new hidden state further comprises:
   calculating a new memory cell state; and
   calculating the new hidden state based on the new memory cell state.

10. A device comprising:
    a first digital-to-analog converter (DAC) configured to convert a digital input signal into an analog input signal;
    a second DAC configured to convert a digital previous hidden state (PHS) signal into an analog PHS signal;
    a plurality of non-volatile memory (NVM) weight arrays configured to compute a plurality of vector matrix multiplication (VMM) arrays based on the analog input signal and the analog PHS signal, the plurality of NVM weight arrays being coupled to the first DAC and the second DAC;
    one or more analog-to-digital converters (ADCs) coupled to the plurality of NVM weight arrays, the one or more ADCs configured to convert the VMM arrays into digital VMM values; and
    a neural circuit configured to process the digital VMM values into a new hidden state.

11. The device of claim 10, wherein the plurality of NVM weight arrays comprises a plurality of resistive cross-point arrays.

12. The device of claim 10, wherein:
    an array from the plurality of NVM weight arrays includes a plurality of junctions; and
    each junction of the plurality of junctions includes one or more NVM cells.

13. The device of claim 10, wherein:
    the one or more ADCs comprise a plurality of ADCs; and
    the neural circuit comprises a plurality of activation components coupled to the plurality of ADCs, the plurality of activation components configured to receive and process the digital VMM values.

14. The device of claim 13, wherein the neural circuit further comprises arithmetic circuitry coupled to the plurality of activation components, the arithmetic circuitry being configured to generate the new hidden state based on an output received from each of the plurality of activation components.

15. The device of claim 13, further comprising a plurality of analog integrate and average components situated between the plurality of NVM weight arrays and the plurality of ADCs.

16. The device of claim 13, further comprising a plurality of analog integrate and average components situated after the plurality of activation components.

17. The device of claim 10, wherein the neural circuit is further configured to calculate a new memory cell state, wherein the new hidden state is generated by the neural circuit based on the new memory cell state.

18. The device of claim 10, wherein an output of one or more of the first DAC, the second DAC, the plurality of NVM weight arrays, and the one or more ADCs is quantized to about 4 bits or less.

19. A circuit, comprising:
    means for converting a digital input signal into an analog input signal;
    means for converting a digital previous hidden state (PHS) signal into an analog PHS signal;
    means for computing a plurality of vector matrix multiplication (VMM) arrays based on the analog input signal and the analog PHS signal;
    means for converting the VMM arrays into digital VMM values; and means for processing the digital VMM values into a new hidden state.

20. The circuit of claim 19, wherein the means for processing the digital VMM values into the new hidden state further comprises:
 means for processing the digital VMM values into a forget gate value, an input gate value, an output gate value, and a new candidate memory cell value; and
 means for calculating the new hidden state based on the forget gate value, the input gate value, the output gate value, and the new candidate memory cell value.

21. The circuit of claim 19, wherein one or more of the analog input signal, the analog PHS signal, and the digital VMM values are quantized to about 4 bits or less.

22. The circuit of claim 19, further comprising means for inputting the new hidden state as the digital PHS on a subsequent cycle.

23. The circuit of claim 19, wherein the means for processing the digital VMM values into the new hidden state further comprises:
 means for calculating a new memory cell state; and
 means for calculating the new hidden state based on the new memory cell state.

24. The circuit of claim 19, wherein the plurality of VMM arrays is further computed using a plurality of non-volatile memory (NVM) weight arrays.

\* \* \* \* \*